(12) United States Patent
Volfovski et al.

(10) Patent No.: US 9,706,605 B2
(45) Date of Patent: Jul. 11, 2017

(54) SUBSTRATE SUPPORT WITH FEEDTHROUGH STRUCTURE

(71) Applicant: APPLIED MATERIALS, INC., Santa Clara, CA (US)

(72) Inventors: Leon Volfovski, Mountain View, CA (US); Mayur G. Kulkarni, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 709 days.

(21) Appl. No.: 13/845,492

(22) Filed: Mar. 18, 2013

(65) Prior Publication Data

US 2013/0256966 A1 Oct. 3, 2013

Related U.S. Application Data

(60) Provisional application No. 61/617,946, filed on Mar. 30, 2012.

(51) Int. Cl.
| | |
|---|---|
| *H05B 3/26* | (2006.01) |
| *H01L 21/67* | (2006.01) |
| *H01L 21/687* | (2006.01) |

(52) U.S. Cl.
CPC ......... *H05B 3/26* (2013.01); *H01L 21/67103* (2013.01); *H01L 21/68792* (2013.01)

(58) Field of Classification Search
CPC ............... H05B 3/26; H01L 21/67103; H01L 21/68792
See application file for complete search history.

(56) References Cited

U.S. PATENT DOCUMENTS

| | | |
|---|---|---|
| 4,394,712 A | 7/1983 | Anthony |
| 5,333,095 A | 7/1994 | Stevenson |

(Continued)

FOREIGN PATENT DOCUMENTS

| | | |
|---|---|---|
| JP | 63-125311 U | 5/1988 |
| JP | H05-021381 A | 1/1993 |

(Continued)

OTHER PUBLICATIONS

International Search Report and Written Opinion mailed Jul. 18, 2013 for PCT Application No. PCT/US2013/032874.

(Continued)

*Primary Examiner* — Joseph J Hail
*Assistant Examiner* — Joel Crandall
(74) *Attorney, Agent, or Firm* — Moser Taboada; Alan Taboada

(57) ABSTRACT

Apparatus for providing electrical currents and substrate supports utilizing the same are provided. In some embodiments, a feedthrough structure may include a body having a wall defining one or more openings disposed through the body from a first end to a second end; one or more first conductors and one or more second conductors each disposed in the wall from the first end to the second end; and a plurality of conductive mesh disposed in the wall, at least one conductive mesh surrounding a first region of the wall including the one or more first conductors and at least one conductive mesh surrounding a second region of the wall including the one or more second conductors, wherein the plurality of conductive mesh substantially electrically insulates the first and second regions from respective first and second external electromagnetic fields respectively disposed outside the first and second regions.

19 Claims, 4 Drawing Sheets

(56) References Cited

U.S. PATENT DOCUMENTS

| | | | | |
|---|---|---|---|---|
| 5,521,358 | A * | 5/1996 | Eilentropp | H05B 3/56 174/102 R |
| 5,820,448 | A * | 10/1998 | Shamouilian | B24B 37/042 451/285 |
| 5,905,627 | A | 5/1999 | Brendel et al. | |
| 6,899,607 | B2 * | 5/2005 | Brown | 451/288 |
| 2002/0042246 | A1 * | 4/2002 | Togawa et al. | 451/288 |
| 2003/0008600 | A1 * | 1/2003 | Ide | B24B 37/013 451/41 |
| 2003/0114077 | A1 * | 6/2003 | Yang | B24B 37/32 451/7 |
| 2003/0119429 | A1 * | 6/2003 | Bright et al. | 451/67 |
| 2004/0053560 | A1 * | 3/2004 | Sun et al. | 451/36 |
| 2004/0137829 | A1 * | 7/2004 | Park et al. | 451/41 |
| 2004/0140862 | A1 * | 7/2004 | Brown et al. | 333/117 |
| 2005/0107015 | A1 * | 5/2005 | Togawa et al. | 451/285 |
| 2006/0005930 | A1 | 1/2006 | Ikeda et al. | |
| 2007/0049166 | A1 * | 3/2007 | Yamaguchi et al. | 451/5 |
| 2008/0236493 | A1 | 10/2008 | Sakao | |
| 2009/0061745 | A1 * | 3/2009 | Heinrich | B24B 37/24 451/289 |
| 2010/0046134 | A1 | 2/2010 | Mizuno et al. | |
| 2011/0080094 | A1 | 4/2011 | Setsuhara et al. | |
| 2011/0149462 | A1 | 6/2011 | Kugimoto et al. | |

FOREIGN PATENT DOCUMENTS

| | | |
|---|---|---|
| JP | H07-106319 A | 4/1995 |
| JP | H07-316811 A | 12/1995 |
| JP | H08-139039 A | 5/1996 |
| JP | H09-046875 A | 2/1997 |
| JP | 2002-025912 A | 1/2002 |
| JP | 2002-184844 A | 6/2002 |
| JP | 2002-313144 A | 10/2002 |
| JP | 2004-095722 A | 3/2004 |
| JP | 2007-317772 A | 12/2007 |
| JP | 2011-222931 A | 11/2011 |
| WO | WO 2010/144314 A1 | 12/2010 |

OTHER PUBLICATIONS

Search Report dated Apr. 14, 2016 received from the State Intellectual Property Office of the People's Republic of China for China Application No. 201380016546X.

* cited by examiner

SUBSTRATE SUPPORT WITH FEEDTHROUGH STRUCTURE

CROSS-REFERENCE TO RELATED APPLICATIONS

This application claims benefit of U.S. provisional patent application Ser. No. 61/617,946, filed Mar. 30, 2012, which is herein incorporated by reference in its entirety.

FIELD

Embodiments of the present invention generally relate to substrate processing systems.

BACKGROUND

As the critical dimensions of electronic devices continue to shrink, substrate processing systems require improved process control to achieve such dimensions reproducibly. For example, in some embodiments, substrate supports may be made in a more compact design, such that a uniform temperature profile can be achieved on a substrate disposed thereon, and/or the temperature profile can be changed rapidly during processing. The inventors have discovered that adding such compactness to substrate support design leaves limited space in feedthrough structures to provide the appropriate facilities (e.g., piping and/or wiring) for components such as one or more of a vacuum chuck, an electrostatic chuck, a backside gas line, an electrode, a temperature sensor, a heater, or other suitable devices provided in or on a substrate support.

Accordingly, the inventors have provided improved feedthrough structures that may be utilized with substrate supports.

SUMMARY

Apparatus for providing electrical currents and substrate supports utilizing the same are provided herein. In some embodiments, a feedthrough structure may include a body having a wall defining one or more openings disposed through the body from a first end of the body to a second end of the body; one or more first conductors disposed in the wall from the first end to the second end; one or more second conductors disposed in the wall from the first end to the second end; and a plurality of conductive mesh disposed in the wall, wherein at least one conductive mesh surrounds a first region of the wall that includes the one or more first conductors and wherein at least one conductive mesh surrounds a second region of the wall that includes the one or more second conductors, wherein the plurality of conductive mesh substantially electrically insulates the first region from a first external electromagnetic field outside the first region and the second region from a second external electromagnetic field outside the second region.

In some embodiments, an apparatus may include a substrate support comprising a support member having a substrate processing surface to support a substrate thereon; a plurality of electrical elements disposed in the substrate support to at least one of monitor or process the substrate when disposed on the substrate processing surface; a body having a wall defining one or more openings, the one or more openings disposed between a first end of the body facing the support member and an opposing second end of the body; one or more first conductors disposed in the wall from the first end to the second end to provide a first electrical signal to at least a first one of the plurality of electrical elements; and one or more second conductors disposed in the wall from the first end to the second end to provide a second electrical signal to at least a second one of the plurality of electrical elements.

In some embodiments, an apparatus may include a substrate support comprising a support member having a substrate processing surface to support a substrate thereon; a heater to provide heat to the substrate when present on the substrate processing surface, the heater having a plurality of resistive heating elements arranged into a plurality of heating zones; a plurality of temperature sensors to monitor a temperature of the substrate when present on the substrate processing surface; a body having a wall defining one or more openings, the one or more openings disposed between a first end of the body facing the support member and an opposing second end of the body; a plurality of first conductors disposed in the wall from the first end to the second end, wherein each first conductor provides or receives a first electrical signal from one or more resistive heating elements; a plurality of second conductors disposed in the wall from the first end to the second end, wherein each second conductor provides or receives a second electrical signal from one or more of the temperature sensors; and a plurality of conductive mesh disposed in the wall, wherein at least one conductive mesh surrounds a first region of the wall that includes the one or more first conductors and wherein at least one conductive mesh surrounds a second region of the wall that includes the one or more second conductors, wherein the plurality of conductive mesh substantially electrically insulates the first region from a first external electromagnetic field outside the first region and the second region from a second external electromagnetic field outside the second region.

Other and further embodiments of the present invention are described below.

BRIEF DESCRIPTION OF THE DRAWINGS

Embodiments of the present invention, briefly summarized above and discussed in greater detail below, can be understood by reference to the illustrative embodiments of the invention depicted in the appended drawings. It is to be noted, however, that the appended drawings illustrate only typical embodiments of this invention and are therefore not to be considered limiting of its scope, for the invention may admit to other equally effective embodiments.

Figure 1:
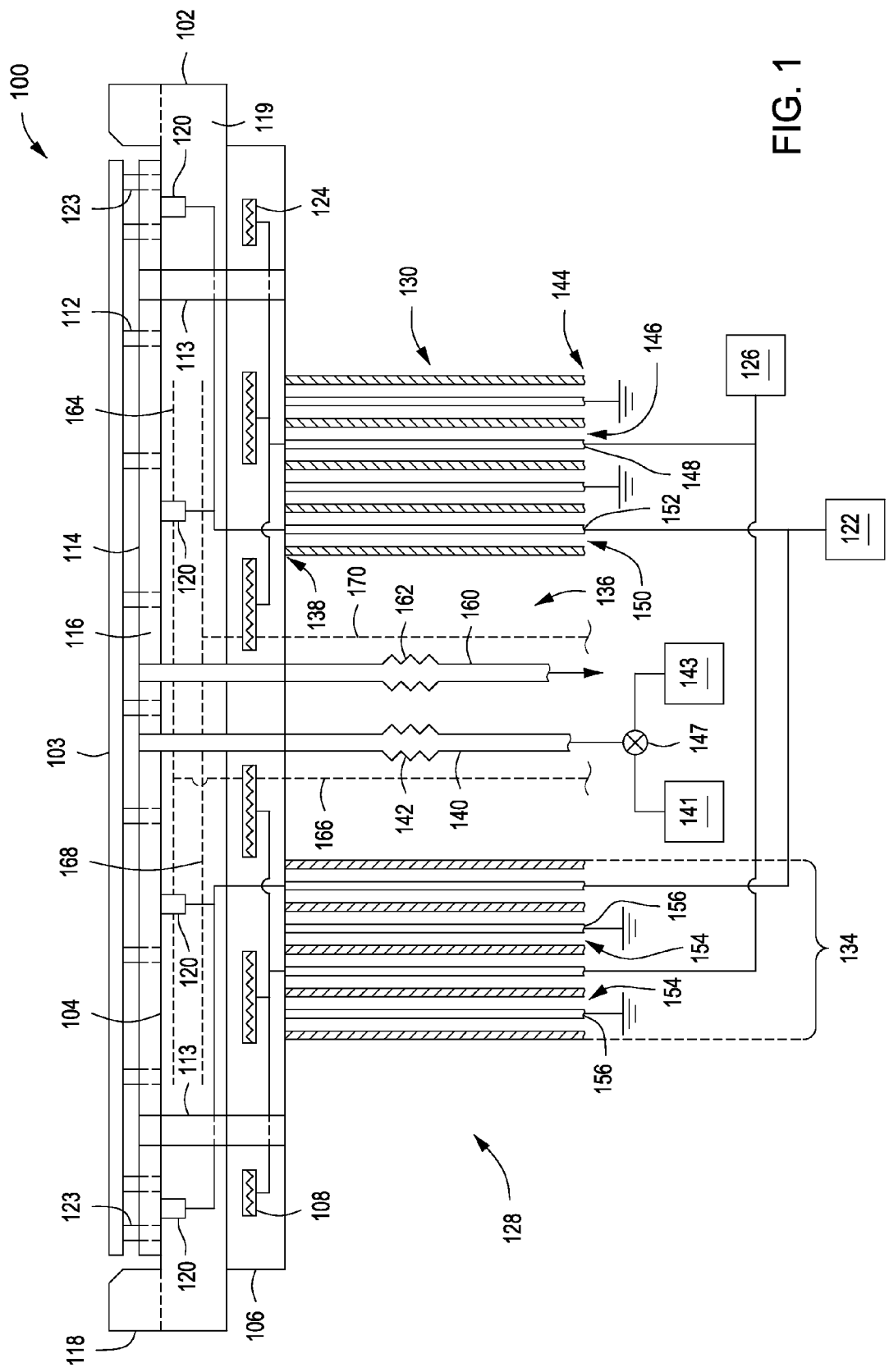
FIG. 1 depicts a partial schematic view of a substrate support having a feedthrough structure in accordance with some embodiments of the present invention.

To facilitate understanding, identical reference numerals have been used, where possible, to designate identical elements that are common to the figures. The figures are not drawn to scale and may be simplified for clarity. It is contemplated that elements and features of one embodiment may be beneficially incorporated in other embodiments without further recitation.

DETAILED DESCRIPTION

Apparatus for providing electrical currents and substrate supports utilizing the same are provided herein. The inventive feedthrough structure may be utilized as part of a substrate support for processing substrates as discussed below. However, the inventive feedthrough structure may be utilized with any suitable devices requiring electrical feedthrough. The inventive apparatus may advantageously provide a compact design for managing a plurality of electrical wiring and/or piping and/or for providing efficient space usage. The inventive apparatus may advantageously provide accurate delivery of multiple different electrical signals by limiting or eliminating interference (e.g., crosstalk) between each signal as discussed below. Further, the inventive feedthrough apparatus may limit or prevent interference from external electromagnetic fields, such as those fields generated by conductors which may be disposed in the walls of the feedthrough structure, conductors which may be present in the one or more openings defined by the walls of the feedthrough structure, or other components that may generate an electromagnetic field, such as a plasma source, electrodes which provide RF energy to generate a plasma above a substrate support or remotely, or an external electromagnetic field generated by the plasma itself.

FIG. 1 depicts a substrate support 100 in accordance with some embodiments of the present invention. The substrate support 100 may include a support member 102 to distribute heat to a substrate 103 when present on or above a first surface 104 (e.g., an upper surface or substrate processing surface) of the support member 102 and a heater 106 having one or more heating zones 108 (multiple heating zones are illustrated in FIG. 1) to provide heat to the support member 102. Optionally, the heater 106 may further include a second heating zone which underlies and spans the one or more heating zones 108 to provide additional temperature control to the first surface 104. As shown in FIG. 1, the heater 106 can be disposed below the support member 102. However, this is merely one exemplary embodiment of the heater 106. The heater 106 may be disposed in the support member 102, on a surface of the support member 102, or below the support member 102.

In some embodiments, the substrate support may provide temperatures ranging from about 450 degrees Celsius to about 600 degrees Celsius. However, embodiments of the substrate support disclosed herein are not limited to the above-mentioned temperature range. For example, the temperature may be lower, such as a room temperature or above, or from about 150 degrees Celsius to about 450 degrees Celsius, or higher, such as greater than about 600 degrees Celsius.

The support member 102 may be utilized to distribute heat to the substrate 103. For example, the support member may act as a heat spreader to diffuse the heat provided by the one or more heating zones 108. In some embodiments, the support member 102 may include one or more temperature monitoring devices 120 embedded in the support member 102 or extending through the support member 102 to monitor the temperature being provided to the substrate 103 at one or more positions along the first surface 104 of the support member 102. The temperature monitoring devices 120 may include any suitable device for monitoring temperature, such as one or more of a temperature sensor, resistance temperature device (RTD), optical sensor, thermocouple, thermistor, or the like. The one or more temperature monitoring devices 120 may be coupled to a controller 122 to receive temperature information from each of the plurality of the temperature monitoring devices 120. The controller 122 may further be used to control the heating zones 108 in response to the temperature information, as discussed further below. The support member 102 may be formed of suitable process-compatible materials, such as materials having one or more of high thermal conductivity, high rigidity, and a low coefficient of thermal expansion. In some embodiment, the support member 102 may have a thermal conductivity of at least about 140 W/mK. In some embodiment, the support member 102 may have a coefficient of thermal expansion of about $9 \times 10^{-6}/°$ C. or less. Examples of suitable materials used to form the support member 102 may include one or more of aluminum (Al), copper (Cu) or alloys thereof, aluminum nitride (AlN), beryllium oxide (BeO), pyrolytic boron nitride (PBN), silicon nitride ($Si_3N_4$), aluminum oxide ($Al_2O_3$), silicon carbide (SiC), graphite coated with PBN, AlN coated with yttria ($Y_2O_3$), or the like. Other suitable coating that may be utilized with the support member 102 include diamond like coatings (DLCs) or the like.

The heater 106 may include one or more resistive heating elements 124. For example, each of the one or more heating zones 108 includes one or more resistive heating elements 124. Although illustrated in FIG. 1 as being uniformly distributed, the one or more heating zones 108 may be distributed in any suitable configuration that is desired to provide a desired temperature profile on the substrate 103. Each of the resistive heating elements 124 may be coupled to a power source 126. The power source 126 may provide any suitable type of power, such as direct current (DC) or alternating current (AC), which is compatible with the resistive heating elements 124. The power source 126 may be coupled to and controlled by the controller 122 or by another controller (not shown), such as a system controller for controlling a process chamber having the substrate support disposed therein, or the like. In some embodiments, the power source 126 may further include a power divider (not shown) that divides the power provided to the resistive heating elements 124 in each heating zone 108. For example, the power divider may act in response to one or more of the temperature monitoring devices 120 disposed proximate the first surface 104 to selectively distribute power to the resistive heating elements 124 in specific heating zones 108. Alternatively, in some embodiments, multiple power sources may be provided for the resistive heating elements in each respective heater zone.

The resistive heating elements 124 and the temperature monitoring devices 120 may be coupled to the power source 126 and controller 122, respectively via a feedthrough structure 128 disposed below the heater 106. In some embodiments, the feedthrough structure 128 may be directly coupled to the backside of the heater 106 via any suitable fastening means and/or methods, such as bolts, welding, epoxy, diffusion bonding, press-fit, co-firing, sintering, or any suitable means and/or methods of attachment. In some embodiments, more than one feedthrough structure 128 may be coupled to the backside of the heater 106, for example, to provide various electrical and/or gas supplies to the heater 106 and/or the other elements of the substrate support 100, such as RF electrodes, electrostatic chucks, the first surface 104, or the like.

Figure 1A:
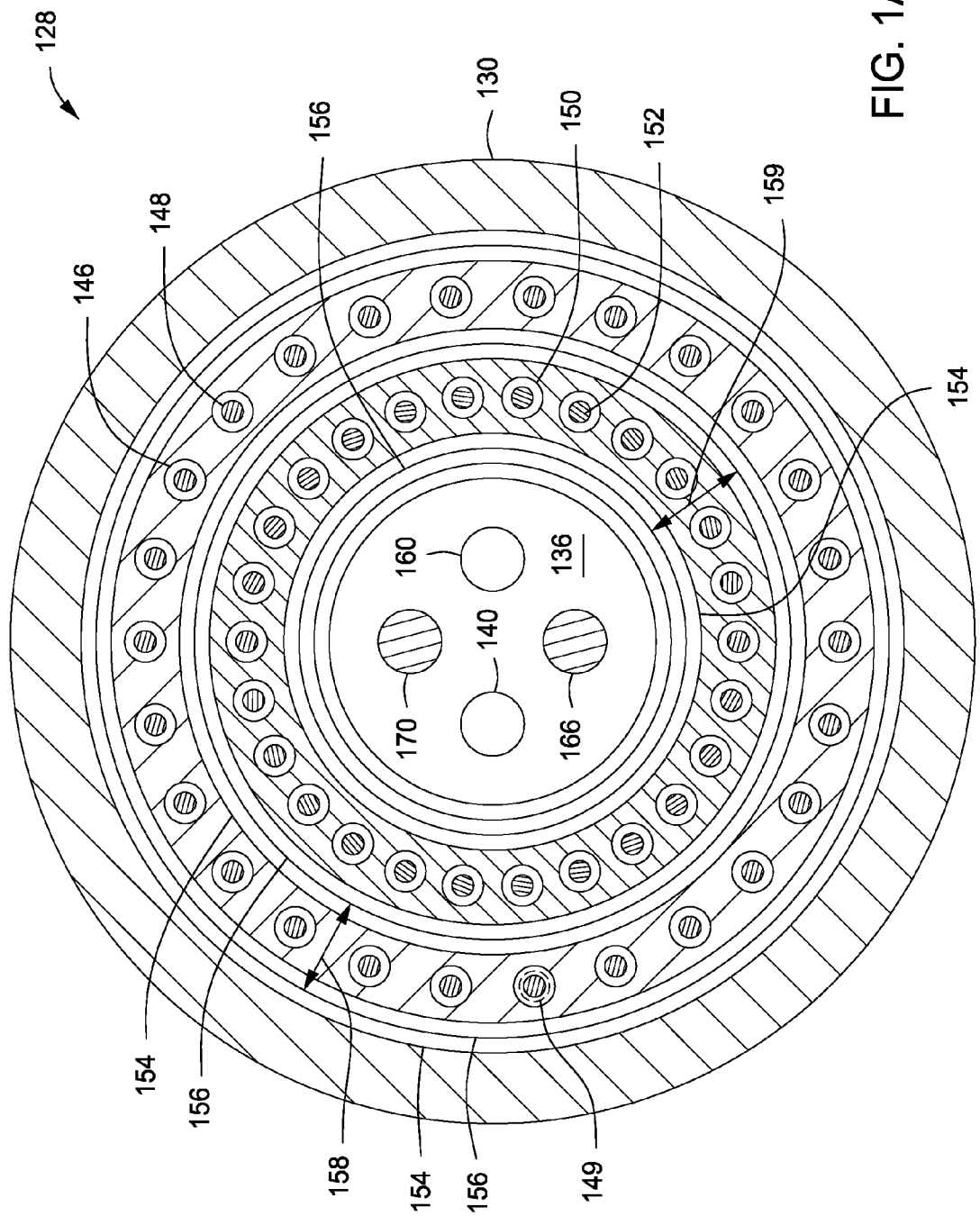
FIG. 1A depicts a cross sectional view of the feedthrough structure depicted in FIG. 1 in accordance with some embodiments of the present invention.

The feedthrough structure 128 is illustrated in side and top cross sectional views in FIGS. 1 and 1A, respectively. The feedthrough structure 128 may include the body 130 having a wall 134 defining one or more openings 136 (a central opening is illustrated in FIGS. 1 and 1A) dispose through the body 130 from a first end 138 to a second end 144. The central opening as illustrated in FIGS. 1-1A is merely exemplary, and other configurations of the one or more openings 136 are possible, such as off-centered configurations, multiple openings or the like. The one or more openings 136 may be utilized to provide wiring and/or conduits for gas, vacuum, RF power, electrostatic chuck power, or any suitable electrical power or gas that may be utilized with a substrate support. For example, wiring may also include optical fibers and devices related thereto. The body 130 may be formed of a dielectric material, such as a ceramic or the like, or other suitable materials having the same or lower thermal conductivity that the support member 102. Conductive elements, e.g. conductors or mesh as discussed below may be separated by any suitable dielectric material, such a ceramic, glass fiber, air, vacuum, or the like.

The body 130 may include a plurality of openings disposed in the wall 134 which may be utilized to house one or more conductive elements, e.g., conductors or mesh as discussed below, along the one or more openings 136 between the first and second ends 138, 144. For example, the conductive elements may be utilized to provide power to electrical devices that are part of the substrate support 100, such as the resistive heating elements 124 or temperature monitoring devices 120, or shield electrical wiring used to carry electrical signals from undesired electromagnetic fields, such as from adjacent electrical wiring and/or other devices, such as RF electrodes, RF energy using remote plasma sources, electrostatic chucks, or the like that may be part of the substrate support 100. The openings in the wall 134 are shown in FIGS. 1-1A as exceeding the dimensions of the various conductive materials dispose therethrough. However, this is merely for illustrative purposes, and the conductive materials may fill the entire opening. The openings in the wall 134 and/or the body 130 may be any suitable shape, such as circular (as illustrated in FIGS. 1 and 1A), rectangular, or any desirable shape. For example, the body 130 may be fabricated from a mold, form or the like such that the openings are formed around the conductive elements rather than the conductive elements being placed into the openings after the openings are formed. However, many methods of fabrication are possible, including those that form the openings prior to placement of the conductive elements within the openings.

The wall 134 may include one or more first openings 146 disposed in the wall 134 along the one or more openings 136 between the first and second ends 138, 144. One or more first conductors 148 may be disposed in the wall 134, e.g., through the one or more first openings 146 between the first and second ends 138, 144. As illustrated in FIG. 1A, the one or more first conductors 148 may be a plurality of first conductors 148 and the one or more first openings 146 may be a plurality of first openings 146, wherein each first conductor 148 is disposed in a corresponding first opening 146. Optionally, each first conductor 148 may be individually shielded with a shield 149 in some embodiments. For example, the shield 149 may be an electrical insulator, such as non-conductive material, or alternatively, the shield 149 may function as a Faraday cage to isolate each first conductor 148 from external electromagnetic fields. For example, such external electromagnetic fields, can be generated by one or more second conductors 152 as discussed below, conductors which may be present in the one or more openings 136, or other components that may generate an electromagnetic field, such as a plasma source, electrodes which provide RF energy to generate a plasma above the substrate support 100 or remotely, or an external electromagnetic field generated by the plasma itself. Further, the configuration of first conductors 148 and first openings 146 is merely exemplary and other configuration are possible, for example, such as a single first opening 146 having a plurality of first conductors 148 disposed therein, wherein each first conductor 148 may include a shield 149 and/or be physically separated by any suitable configurations which keeps adjacent first conductors 148 from contacting each other.

As illustrated in FIG. 1, the one or more first conductors 148 may be utilized to couple the power source 126 to each of the resistive heating elements 124. in some embodiments, each first conductor 148 may be configured to both provide and return power, such as using a plurality of adjacent wires insulated from each other. The one or more first conductors 148 may be conductive wires to provide one or more electrical signals. Alternatively, the one or more first conductors 148 may be devices, for example, such as thermocouples, or optical wires, such as fiber optic cables or the other suitable optical wires.

The wall 134 may include one or more second openings 150 disposed in the wall 134 along the one or more openings 136 between the first and second ends 138, 144. One or more second conductors 152 may be disposed in the wall 134, e.g., through the one or more second openings 150 between the first and second ends 138, 144. As illustrated in FIG. 1A, the one or more second conductors 152 may be a plurality of second conductors 152 and the one or more second openings 150 may be a plurality of second openings 150, wherein each second conductor 152 is disposed in a corresponding second opening 150. The shield 149 may be utilized with the second conductors 152 in a substantially similar manner as discussed above for the first conductors 148. Further, the configuration of second conductors 152 and second openings 150 is merely exemplary and other configuration are possible, for example, such as a single second opening 150 having a plurality of second conductors 152 disposed therein, wherein each second conductor 152 may include a shield 149 and/or be physically separated by any suitable configurations which keeps adjacent second conductors 152 from contacting each other.

As illustrated in FIG. 1, the one or more second conductors 152 may be utilized to couple the controller 122 to each of the temperature monitoring devices 120. For example, one second conductor 152 may provide an electrical signal to a given temperature monitoring device 120 and another second conductor 152 may return an electrical signal to the controller 122. In some embodiments, the number of second conductors 152 may be double, triple, or greater than triple that of the number of temperature monitoring devices 120. For example, the additional number of second conductors 152 relative to that of the temperature monitoring devices 120 may be utilized for resistance compensation along the length of each second conductor 152 or for other purposes. Alternatively, each second conductor 152 may be configured to provide and return an electrical signal as discussed above for a first conductor 148. Similar to the one or more first conductors 148, the one or more second conductors 152 may be conductive wires to provide one or more electrical signals. Alternatively, the one or more second conductors 152 may be devices, for example, such as thermocouples, or optical wires, such as fiber optic cables or the other suitable optical wires.

The wall 134 may include a plurality of third openings 154 disposed in the wall along the one or more openings 136 between the first and second ends 138, 144 (three third openings 154 are illustrated in FIG. 1A). Each third opening 154 may have a conductive mesh 156 disposed therein. As illustrated in FIGS. 1-1A, a third opening 154 and a conductive mesh 156 are disposed on either side of the one or more first conductors 148, such as in concentric rings on either side of the one or more first conductors as shown in FIG. 1A. For example, the conductive mesh 156 in combination as shown in FIG. 1A (e.g., two conductive mesh 156), can surround the one or more first conductors 148 as shown, and electrically insulate the one or more first conductors 148 from external electromagnetic fields, such as those electromagnetic fields generated by a current traveling through the one or more second conductors 152. A first region 158 of the wall 134 between the conductive mesh 156, the first region 158 including the one or more first conductors 148 and the one or more first openings 146, may be electrically insulated from any external electromagnetic fields. For example, such external electromagnetic fields, can be generated by one or more second conductors 152 as discussed below, conductors which may be present in the one or more openings 136, or other components that may generate an electromagnetic field, such as a plasma source, electrodes which provide RF energy to generate a plasma above the substrate support 100 or remotely, or an external electromagnetic field generated by the plasma itself. In some embodiments, the conductive mesh 156 may function in a substantially similar manner to a Faraday cage to isolate external electrical signals from the first region 158 which includes the first conductors 148.

For example, the inventors have discovered that an electromagnetic field generated by the current traveling through a given wire for one device can interfere with another electromagnetic field generated by current traveling through another wire for another device on the substrate support. The interference of the electromagnetic fields may undesirably alter the desired currents provided to each device and may undesirably result in erroneous readings, such as from a monitoring device like a temperature sensor, and/or the wrong processing parameter being delivered to the substrate, such as temperature from a heater or radio frequency (RF) energy from an RF electrode. In some embodiments, RF energy can cause interference such as high voltage noise, and/or rapidly changing voltage and/or current in the one or more first conductors 148 and/or the one or more second conductors 152.

A second region 159 that includes the one or more second conductors 152 may be formed between the first region 158 and the one or more openings 136 as illustrated in FIG. 1A, for example, by providing a third conductive mesh 156 disposed between the one or more second conductors and the one or more openings 136. Accordingly, in some embodiments, such as those illustrated in FIG. 1A, the feedthrough structure 128 may include three conductive mesh 156 concentrically disposed about the one or more openings 136 and the first and second regions 158, 159 may be formed between adjacent conductive mesh 156. Similar to the first region 158, the conductive mesh 156 may act to electrically insulate the second region 159 from an external electromagnetic field generated by a current traveling through the one or more first conductors 148, or any external electromagnetic field, such as those external electromagnetic fields discussed above.

Figure 1B:
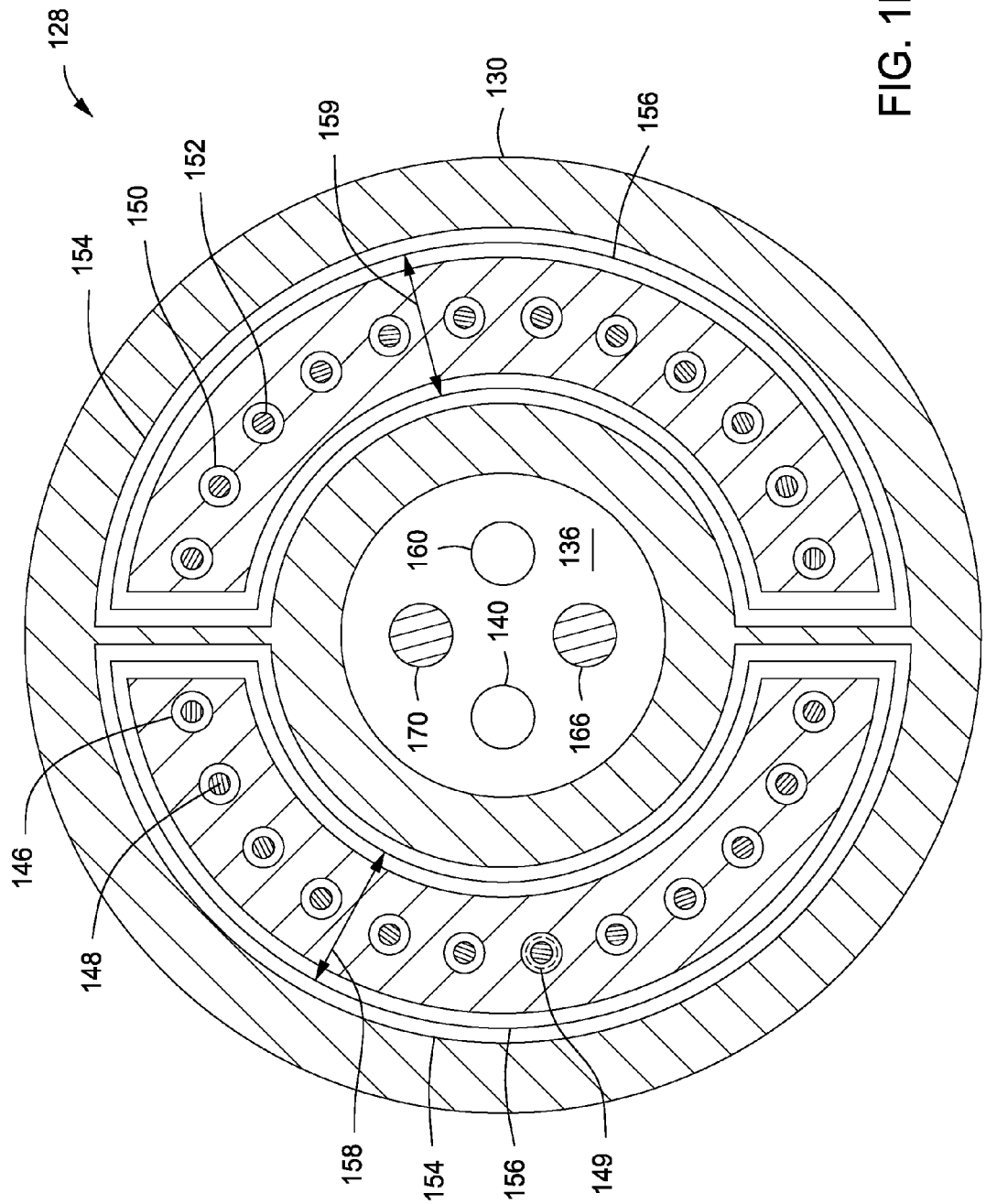
FIG. 1B depicts a cross sectional view of a feedthrough structure in accordance with some embodiments of the present invention.

Alternatively, FIG. 1B depicts the feedthrough structure 128 in accordance with some embodiments of the present invention. As illustrated in FIG. 1B, the feedthrough structure 128 may include two third openings 154, each third opening 154 having a conductive mesh 156 disposed therein. As shown in FIG. 1B, each third opening 154 and conductive mesh 156 may trace a semi-toroidal cross section, wherein the two third openings 154 and two conductive mesh 156 are disposed on opposing sides of the one or more openings 136. Disposed within one semi-toroidal trace may be the first region 158 including the one or more first conductors 148 and within the other semi-toroidal trace may be the second region 159 including the one or more second conductors 152. The conductive mesh 156, first region 158, second region 159, one or more first conductors 148 and one or more second conductors 152 may function in a substantially similar manner in FIG. 1B as is discussed above regarding FIG. 1A.

Returning to FIG. 1, the substrate support 100 may include various optional, exemplary, and non-limiting embodiments as discussed below. In some embodiments, the substrate support 100 may include a first conduit 140 which can at least one of provide a gas from a gas source 141 to the backside of the substrate 103 or provide a vacuum from a vacuum pump 143 (or other vacuum sources) to secure the substrate 103 to the substrate support 100. For example, the vacuum or gas may be alternately provided by a multi-way valve 147 coupling the vacuum pump 143 and gas source 141 to the first conduit 140. For example, the gas provided by the first conduit 140 may be utilized to improve heat transfer (or to achieve repeatable substrate to heater interface) between the support member 102 and the substrate 103. In some embodiments, the gas is helium (He). For example, in operation, the vacuum pump 143 may be used to secure the substrate 103 to the substrate support 100. After the substrate 103 is secured, the gas source 141 may provide a gas to the space between the substrate 103 and the support member 102 to improve heat transfer.

The first conduit 140 may include a flexible section 142, such as a bellows or the like. Such flexibility in the first conduit 140 may be helpful, for example, when the substrate support 100 is leveled, and/or during thermal deformation or expansion of the substrate support 100 during heating. For example, such leveling devices may include kinematic jacks or the like. Further, the substrate support 100 may include a second conduit 160 having a flexible section 162 to exhaust the gas provided by the gas source 141 through the first conduit 140 as illustrated in FIG. 1. However, the gas may also be exhausted by the first conduit 140 through the vacuum pump 143 in the absence of the second conduit 160.

Alternatively, or in combination, the substrate support 100 may include an electrostatic chuck 164 to secure the substrate 103 on the first surface 104. The electrostatic chuck 164 may be powered via one or more third conductors 166 disposed through the one or more openings 136 of the body 130 to provide electrical power to the electrostatic chuck 164. The conductive mesh 156 may further electrically insulate the first region 158 and/or the second region 159 from an external electromagnetic field generated by a current traveling through the one or more third conductors 166.

Alternatively, or in combination, the substrate support 100 may include an electrode 168 to provide RF energy to the substrate 103. The electrode 168 may be powered via one or more fourth conductors 170 disposed through the one or more openings 136 of the body 130 to provide electrical power to the electrode 168. The conductive mesh 156 may further electrically insulate the first region 158 and/or the second region 159 from an external electromagnetic field generated by a current traveling through the one or more fourth conductors 170.

Figure 1C:
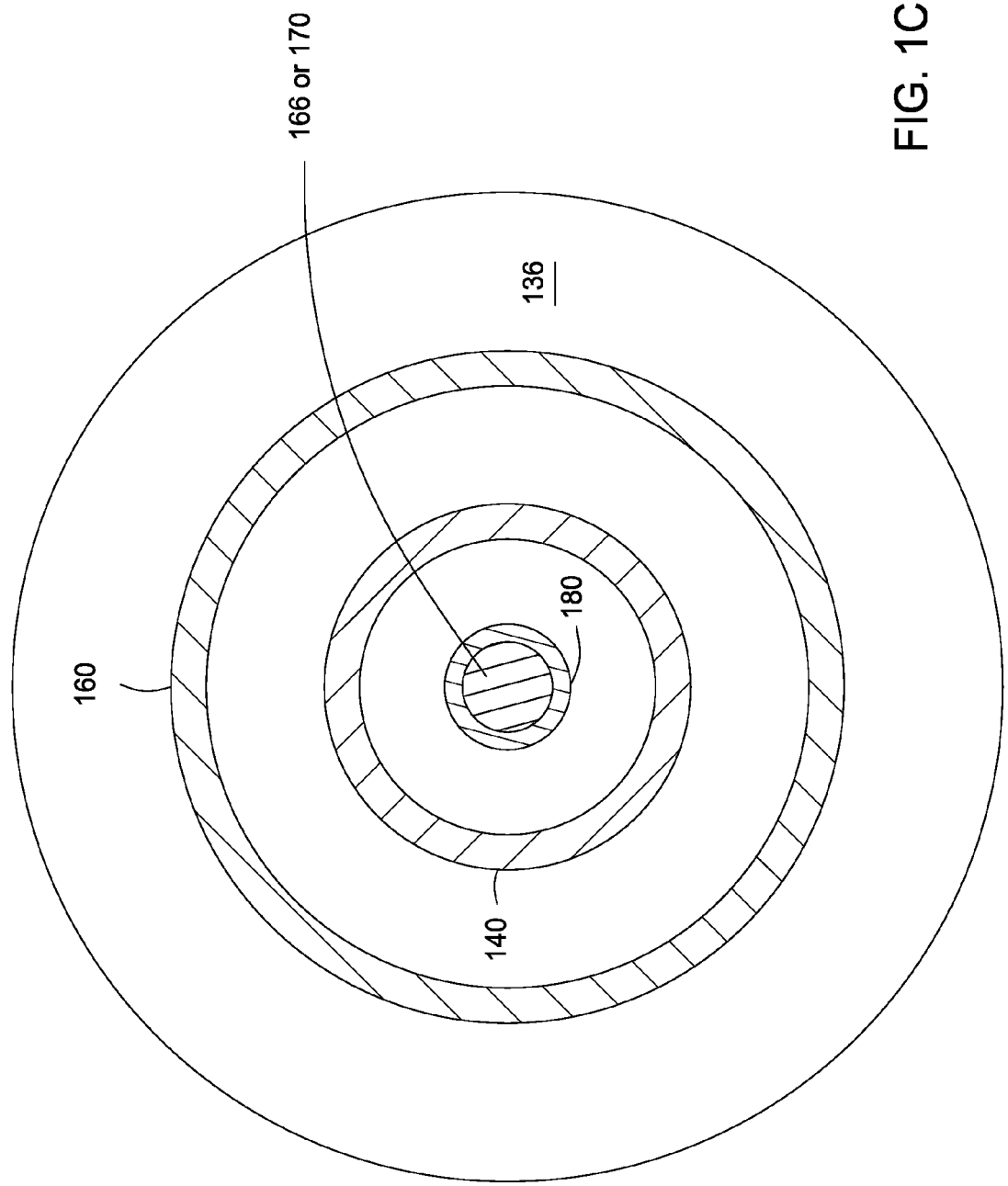
FIG. 1C depicts a partial cross sectional view of a feedthrough structure in accordance with some embodiments of the present invention.

Alternatively, as illustrated in FIG. 1C, one or more of the conduits and/or conductors disposed in the one or more openings 136 maybe be economized to save space in some embodiments. For example, as illustrated in FIG. 1C, the second conduit 160 may be concentrically disposed about the first conduit 140 and the first conduit 140 may be concentrically disposed about the third or fourth conductors 166, 170. Other configurations of the conduits and/or conductors may be possible to save space within the one or more openings 136. Further, a shield 180 may be disposed about the third or fourth conductor 166, 170 as shown in FIG. 1C. The shield 180 may be substantially similar to the shield 149 as discussed above, and may be utilized as an electrical insulator and/or a Faraday cage.

In some embodiments, the substrate support 100 may include a plurality of substrate support pins 112 disposed a first distance above the first surface 104 of the support member 102, the plurality of substrate support pins 112 can support a backside surface of the substrate 103 when present on the substrate support. The plurality of substrate support pins 112 may be surrounded by a support ring 123. The support ring 123 may contact the backside of the substrate 103 proximate the peripheral edge of the substrate 103. For example, the support ring 123 may be used, for example, to define a space or volume between the backside of the substrate 103 and the substrate support 100. For example, the space may be used to form a vacuum for securing the substrate 103 to substrate support 100 and/or to provide a gas for heat transfer between the substrate support 100 and the substrate 102 as discussed above.

In some embodiments, (as illustrated by the dotted lines proximate each substrate support pin 112 and the support ring 123) each of the plurality of substrate support pins and support ring 123 may extend from the first surface 104 of the support member 102 (e.g., the substrate support pins 112 and support ring 123 may be a part of, and formed in the support member 102). Alternatively, in some embodiments, a support layer 116 may be disposed on the first surface 104 of the support member 102 and each of the plurality of substrate support pins 112 and the support ring 123 may extend from a surface 114 of the support layer 116. In some embodiments, the support layer 116 and each of the plurality of substrate support pins 112 and the support ring 123 may be formed from the same material. For example, the support layer 116 and the each of the substrate support pins 112 and the support ring 123 may be a one-piece structure (illustrated in FIG. 2A and discussed below). The support layer and each of the plurality of substrate support pins 112 and the support ring 123 can be formed of suitable process-compatible materials having wear resistant properties. For example, materials may be compatible with the substrate, with processes to be performed on the substrate, or the like. In some embodiments, the support layer 116 and/or the substrate support pins 112 and/or the support ring 123 may be fabricated from a dielectric material. In some embodiments, the materials used to form the support layer 116 and/or the substrate support pins 112 and/or the support ring 123 may include one or more of a polyimide (such as KAPTON®), aluminum oxide ($Al_2O_3$), aluminum nitride (AlN), silicon dioxide ($SiO_2$), silicon nitride ($Si_3N_4$), silicon carbon (SiC), quartz, sapphire or the like. In some embodiments, for example for low temperature applications (e.g., at temperatures below about 200 degrees Celsius), the support layer 116 and/or the substrate support pins 112 and/or the support ring 123 may comprise KAPTON®.

In some embodiments, the substrate support 100 may include an alignment guide 118 extending from the first surface 104 of the support member 102 and about the plurality of substrate support pins 112 (e.g., proximate an outer edge 119 of the support member 102). The alignment guide 118 may serve to guide, center, and/or align the substrate 103, such as with respect to the one or more heating zones 108 disposed below the substrate 103, for example, when the substrate is lowered onto the substrate support pins 112 by a plurality of lift pins (not shown—lift pins holes 113 are illustrated in FIG. 1 and may extend through support layer 116 and support member 102).

The alignment guide 118 may be formed of suitable process compatible materials, such as materials having wear resistant properties and/or a low coefficient of thermal expansion. The alignment guide 118 may be a single piece or an assembly of multiple components. In some embodiments, the alignment guide 118 may be fabricated from a dielectric material. For example, suitable materials used to form the alignment guide 118 may include one or more of CELAZOLE® PBI (polybenzlmidazole), aluminum oxide ($Al_2O_3$), or the like. Generally, materials for any of the various components of the substrate support 100 may be selected based on chemical and thermal compatibility of the materials with each other and/or with a given process application.

While the foregoing is directed to embodiments of the present invention, other and further embodiments of the invention may be devised without departing from the basic scope thereof.

The invention claimed is:

1. A feedthrough structure for a substrate support, comprising:
   a body having a wall defining one or more openings disposed through the body from a first end of the body to a second end of the body;
   one or more first openings disposed in the wall between the first and second end;
   one or more second openings disposed in the wall between the first and second end;
   one or more first conductors disposed through the wall from the first end to the second end in the one or more first openings;
   one or more second conductors disposed through the wall from the first end to the second end in the one or more second openings; and
   a plurality of conductive mesh disposed in the wall, wherein at least one conductive mesh surrounds a first region of the wall that includes the one or more first conductors and wherein at least one conductive mesh surrounds a second region of the wall that includes the one or more second conductors, wherein the plurality of conductive mesh substantially electrically insulates the first region from a first external electromagnetic field outside the first region and the second region from a second external electromagnetic field outside the second region.

2. The feedthrough structure of claim 1, further comprising:
   one or more third conductors disposed in the one or more openings wherein the plurality of conductive mesh electrically insulate the first and second regions from a third external electromagnetic field generated by a current traveling through the one or more third conductors.

3. The feedthrough structure of claim 1, wherein the plurality of conductive mesh further comprises:
   a first conductive mesh;
   a second conductive mesh concentrically disposed about the first conductive mesh; and
   a third conductive mesh concentrically disposed about the second conductive mesh, wherein the first region is formed between the second and third conductive mesh and the second region is formed between the first and second conductive mesh.

4. The feedthrough structure of claim 1, wherein the plurality of conductive mesh further comprises:
a first conductive mesh that surrounds the first region; and
a second conductive mesh that surrounds the second region.

5. The feedthrough structure of claim 1, wherein the body further comprises:
a plurality of third openings disposed in the wall between the first and second end, each third opening having one of the plurality of conductive mesh disposed therethrough.

6. The feedthrough structure of claim 5, wherein the one or more first openings are a plurality of first openings and wherein the one or more first conductors are a plurality of first conductors, wherein each first conductor is disposed in a corresponding first opening.

7. A substrate support, comprising:
a support member having a substrate processing surface to support a substrate thereon;
a plurality of electrical elements disposed in the substrate support to at least one of monitor or process the substrate when disposed on the substrate processing surface;
a body having a wall defining one or more openings, the one or more openings disposed between a first end of the body facing the support member and an opposing second end of the body;
one or more first conductors disposed in the wall from the first end to the second end to provide a first electrical signal to at least a first one of the plurality of electrical elements;
one or more second conductors disposed in the wall and from the first end to the second end to provide a second electrical signal to at least a second one of the plurality of electrical elements, wherein the one or more first conductors, the one or more second conductors, or both, are conductive wires disposed in the wall; and
a plurality of conductive mesh disposed in the wall, wherein at least one conductive mesh surrounds a first region of the wall that includes the one or more first conductors and wherein at least one conductive mesh surrounds a second region of the wall that includes the one or more second conductors, wherein the plurality of conductive mesh substantially electrically insulates the first region from a first external electromagnetic field outside the first region and the second region from a second external electromagnetic field outside the second region.

8. The substrate support of claim 7, further comprising:
one or more third conductors disposed in the one or more openings wherein the plurality of conductive mesh electrically insulate the first and second regions from a third external electromagnetic field generated by a current traveling through the one or more third conductors.

9. The substrate support of claim 7, wherein the plurality of conductive mesh further comprises:
a first conductive mesh;
a second conductive mesh concentrically disposed about the first conductive mesh; and
a third conductive mesh concentrically disposed about the second conductive mesh, wherein the first region is formed between the second and third conductive mesh and the second region is formed between the first and second conductive mesh.

10. The substrate support of claim 7, wherein the plurality of conductive mesh further comprises:
a first conductive mesh that surrounds the first region; and
a second conductive mesh that surrounds the second region.

11. The substrate support of claim 7, further comprising:
one or more first openings disposed in the wall between the first and second end and having the one or more first conductors disposed therethrough;
one or more second openings disposed in the wall between the first and second end and having the one or more second conductors disposed therethrough; and
a plurality of third openings disposed in the wall between the first and second end, wherein each third opening having one of the plurality of conductive mesh disposed therethrough.

12. The substrate support of claim 11, wherein the one or more first openings are a plurality of first openings and wherein the one or more first conductors are a plurality of first conductors, wherein each first conductor is disposed in a corresponding first opening.

13. The substrate support of claim 7, wherein at least a first one of the plurality of electrical elements is a heater having a plurality of resistive heating elements and wherein at least a second one of the plurality of electrical elements is a plurality of temperature sensors.

14. The substrate support of claim 13, wherein the plurality of resistive heating elements are arranged into one or more heating zones.

15. The substrate support of claim 7, further comprising:
an electrostatic chuck for securing the substrate when present on the substrate processing surface; and
one or more third conductors disposed through the one or more openings of the body to provide electrical power to the electrostatic chuck, wherein the plurality of conductive mesh electrically insulate the first region and the second region from a third external electromagnetic field generated by a current traveling through the one or more third conductors.

16. The substrate support of claim 7, further comprising:
one or more conduits disposed through the one or more openings of the body; and
a vacuum apparatus coupled to the one or more conduits to provide suction via the one or more conduits to a backside of the substrate when present to secure the substrate on the substrate processing surface.

17. The substrate support of claim 7, further comprising:
an electrode to provide RF energy to the substrate when present on the substrate processing surface; and
one or more fourth conductors disposed through the one or more openings of the body to provide electrical power to the electrode, wherein the plurality of conductive mesh electrically insulate the first region and the second region from a fourth external electromagnetic field generated by a current traveling through the one or more fourth conductors.

18. A substrate support, comprising:
a support member having a substrate processing surface to support a substrate thereon;
a heater to provide heat to the substrate when present on the substrate processing surface, the heater having a plurality of resistive heating elements arranged into a plurality of heating zones;

a plurality of temperature sensors to monitor a temperature of the substrate when present on the substrate processing surface;

a body having a wall defining one or more openings, the one or more openings disposed between a first end of the body facing the support member and an opposing second end of the body;

a plurality of first conductors disposed in the wall from the first end to the second end, wherein each first conductor provides or receives a first electrical signal from one or more resistive heating elements;

a plurality of second conductors disposed in the wall from the first end to the second end, wherein each second conductor provides or receives a second electrical signal from one or more of the temperature sensors; and a plurality of conductive mesh disposed in the wall, wherein at least one conductive mesh surrounds a first region of the wall that includes the plurality of first conductors and wherein at least one conductive mesh surrounds a second region of the wall that includes the plurality of second conductors, wherein the plurality of conductive mesh substantially electrically insulates the first region from a first external electromagnetic field outside the first region and the second region from a second external electromagnetic field outside the second region.

19. The substrate support of claim 18, wherein the body further comprises:

a plurality of first openings disposed in the wall between the first and second end, each first opening having a corresponding first conductor disposed therethrough;

a plurality of second openings disposed in the wall between the first and second end, each second opening having a corresponding second conductor disposed therethrough; and a plurality of third openings disposed in the wall between the first and second end, wherein each third opening having one of the plurality of conductive mesh disposed therethrough.

* * * * *